United States Patent [19]
Yang et al.
[11] 3,893,039
[45] July 1, 1975

[54] TWO-CHANNEL PHASE-LOCKED LOOP

[75] Inventors: Joseph H. Yang, Towson; Stephen S. Wolff, Silver Spring, both of Md.

[73] Assignee: The United States of America as represented by the Secretary of the Navy, Washington, D.C.

[22] Filed: May 2, 1974

[21] Appl. No.: 466,364

[52] U.S. Cl. .................................... 331/12; 331/17
[51] Int. Cl. ............................................ H03b 3/04
[58] Field of Search ................ 331/12, 17; 329/124

[56] References Cited

UNITED STATES PATENTS

| | | | |
|---|---|---|---|
| 2,481,659 | 9/1949 | Guanella | 331/12 |
| 2,522,371 | 9/1950 | Guanella et al. | 331/12 |
| 3,101,448 | 9/1963 | Costas | 331/12 |
| 3,204,185 | 9/1965 | Robinson | 331/12 |
| 3,789,316 | 1/1974 | Goetz et al. | 331/12 |
| 3,792,478 | 2/1974 | Le Parquier | 331/12 |
| 3,805,183 | 4/1974 | Lance | 331/17 |

*Primary Examiner*—John Kominski
*Attorney, Agent, or Firm*—R. S. Sciascia; P. Schneider; W. Ellis

[57] ABSTRACT

A phase-lock loop for making the error signal to the VCO independent of the input signal amplitude comprising first and second mixers to which an input signal is applied as one of the inputs, first and second low-pass filters to filter the outputs from the first and second mixers respectively, a divider to divide the filtered signal from the first mixer by the filtered signal from the second mixer, a non-linearity network to shape the divider output to a desired function, a VCO to take the non-linearity network output as its control signal and to provide a signal directly to the first mixer to be mixed with the input signal and indirectly through a 90° phase-shifter to the second mixer to be mixed with the input signal.

7 Claims, 1 Drawing Figure

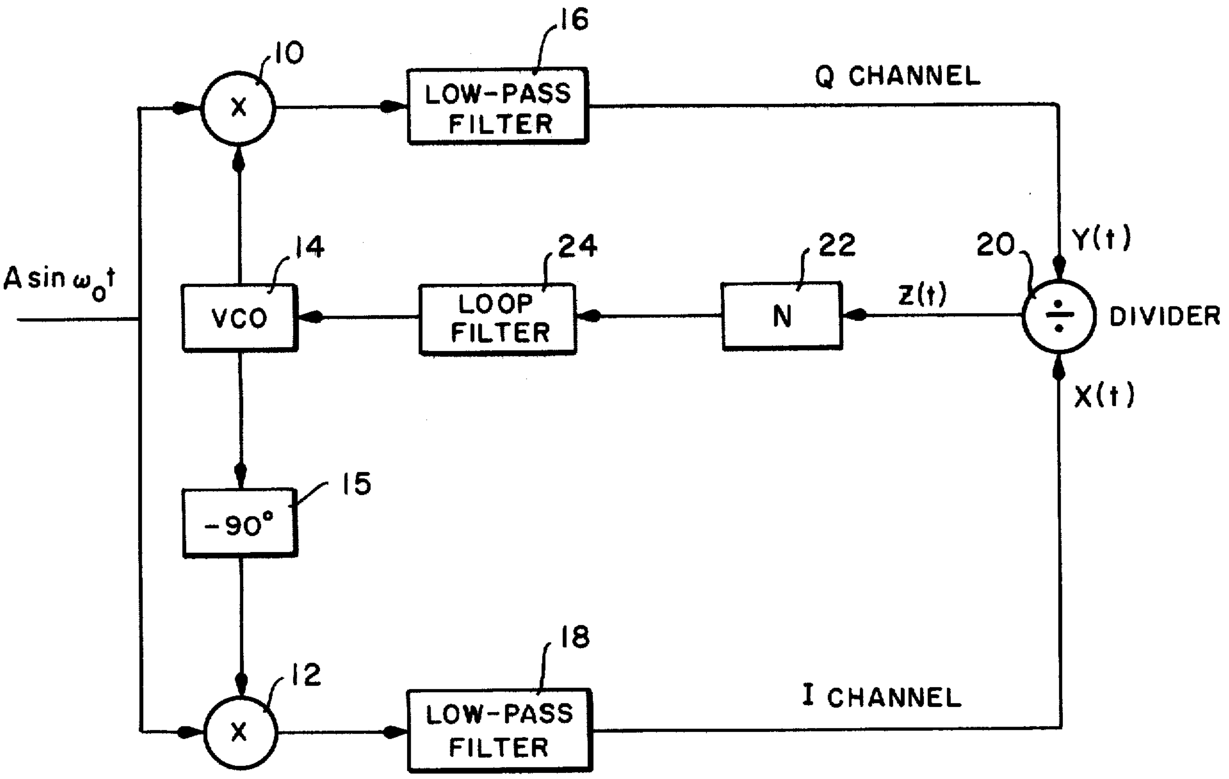
LOW-PASS FILTER
Q CHANNEL
A sin $\omega_0$t
VCO
LOOP FILTER
N
Z(t)
DIVIDER
Y(t)
X(t)
-90°
I CHANNEL

TWO-CHANNEL PHASE-LOCKED LOOP

BACKGROUND OF THE INVENTION

1. Field of Invention

The present invention is related generally to frequency tracking and in particular to a two-channel, phase-lock loop.

2. Prior Art

The purpose of a phase-lock loop is to match a voltage-controlled-oscillator (VCO) signal in phase and frequency with a sinusoidal input signal. The error signal generated by such a loop is generally proportional to the amplitude of the incoming signal. Thus this error signal is always limited by the input signal amplitude regardless of how much frequency compensation is required at the VCO.

SUMMARY OF THE INVENTION

Briefly, the present invention removes the upper limit imposed by the input signal amplitude in a phase-lock loop by dividing a filtered VCO-input signal mixer product by its quadrature signal and feeding this signal back to control the VCO frequency.

OBJECTS OF THE INVENTION

An object of the present invention is to remove phase-lock-loop error signal dependence on the amplitude of the input signal.

A further object of the present invention is to remove the upper boundary on the possible error voltage that can be developed in a phase-lock-loop.

Other objects, advantages and novel features of the present invention will become apparent from the following detailed description of the invention when considered in conjunction with the accompanying drawing.

BRIEF DESCRIPTION OF THE DRAWING

The drawing is a block diagram of one embodiment of the present invention.

DETAILED DESCRIPTION OF THE PREFERRED EMBODIMENT

The purpose of any phase-locked loop is to cause either the frequency or the phase of the signal from a self-contained voltage-controlled oscillator to match the frequency or phase of a sinusoidal input signal (A sin $\omega_o t$). The drawing shows a block diagram of a two-channel phase-lock loop to provide such a matching and in addition to remove all dependence on the amplitude of the sinusoidal input signal.

The operation of this two-channel loop is as follows. The input signal, A sin $\omega_o t$, is applied to each of two mixers 10 and 12 as one of their inputs. The other input to the mixer 10 is the VCO signal sin $(\omega_o t + \alpha)$ from the VCO 14. ($\alpha$ is the amount by which the VCO signal is out of phase with the input signal sin $\omega_o t$).

This VCO signal sin $(\omega_o t + \alpha)$ and the input signal sin $\omega_o t$ are mixed together to give an output proportional to the product of the inputs A/2 (sin $\alpha$ + sin $(2\omega_o t + \alpha)$). This product signal is then passed through a low pass filter 16 to remove the double frequency component sin $(2\omega_o t + \alpha)$. Thus the output of filter 16 is A/2 sin $\alpha$.

Similarly, the other input to the mixer 12 is the VCO signal sin $(\omega_o t + \alpha)$ phase-shifted by 90° by the phase-shifter 15. Thus this input is $\cos(\omega_o t + \alpha)$. This quadrature VCO signal cos $(\omega_o t + \alpha)$ is mixed with the input signal sin $\omega_o t$ in the mixer 12 to give the product signal.

$$\frac{A}{2}(\cos\alpha + \cos(2\omega_o t + \alpha)).$$

This product signal is passed through a low pass filter 18 to remove the double frequency component cos $(2\omega_o t + \alpha)$. Thus the output from filter 18 is A/2 cos $\alpha$.

These two filtered product signals, A/2 sin $\alpha$ and A/2 cos $\alpha$ are then fed to a divider circuit 20 which performs the division $$\frac{\frac{A}{2}\sin\alpha}{\frac{A}{2}\cos\alpha} = \tan\alpha$$

This division signal tan $\alpha$ is then sent directly to the VCO input as an error signal.

This division process, as can be seen from an examination of the division signal, removes all dependence of the error signal on the input signal amplitude A since both A/2 sin $\alpha$ and A/2 cos $\alpha$ are linear functions of the input signal amplitude.

Thus now, theoretically, this circuit has the ability to track in any frequency range since the error voltage to the VCO has no upper voltage limit and can go to infinity as the phase error approaches 90°. In reality, the locking range of the loop is limited, but only by the dynamic range of the circuitry chosen to implement this loop.

An instantaneous non-linearity circuit 22 can be placed between the divider 22 and the VCO 14. Such a circuit permits the phase-detector characteristics of the loop to be chosen at will from among any functions periodic over $-\pi/2, \pi/2$. Thus the shape of the D.C. error voltage vs. frequency curve (TAN frequency without an N circuit) can be tailored to any shape of error function found desirable. Nonlinearity circuits are well-known in the electronics art. The basic design principles used in obtaining the different types of nonlinearities are described in the book by W. H. Huggins and D. R. Entwisle called *Introductory Systems and Design*, at pages 236–260.

A loop filter may also be added in the divider-VCO connection if a second order (two poles and a zero) or higher loop is desired. Loop filters are also well known in the art and a reference discussing their design is the book by A. J. Viterbi called *Principles of Synchronous Communication.*

Obviously, many modifications and variations of the present invention are possible in light of the above teachings. It is therefore to be understood that, within the scope of the appended claims, the invention may be practiced otherwise than as specifically described.

What is claimed is:

1. A phase-lock loop comprising:

first mixer means;

second mixer means;

input means for applying an input signal to said first and said second mixer means;

voltage-controlled oscillator means applying its output signal directly to said first mixer means to be mixed with the input signal and also applying its output signal phase-shifted by 90° to said second mixer to be mixed with the input signal;

first filter means taking an input from the output of said first mixer means and applying as its output a first signal;

second filter means taking an input from the output of said second mixer means and applying as its output a second signal substantially identical to said first signal except for a quadrature phase relation between the two signals; and divider means taking as inputs said substantially identical first and second signals from said first and said second filter means and dividing said first signal by said second signal to obtain a quotient signal which is not a function of the amplitude of said input signal and applying said quotient signal to said voltage-controlled oscillator means as the control signal.

2. A phase-lock loop as in claim 1 further comprising a loop filter means connected in electrical series between said divider means and said voltage-controlled oscillator.

3. A phase-lock loop as in claim 1 further comprising a non-linearity network for shaping the output signal from said divider means into a function which is periodic over the range $-\pi/2$ to $+\pi/2$, said network being connected in electrical series between said divider means and said voltage-controlled oscillator.

4. A phase-lock loop as in claim 1 wherein said first and second filter means are low-pass filters.

5. A phase-lock loop as in claim 1, wherein said voltage-controlled oscillator means comprises a voltage-controlled oscillator with a 90° phase-shifter connected to one of its outputs.

6. A method of phase-locking onto a signal comprising the steps of:

a. mixing an input signal with both a VCO signal to be locked and the quadrature of the VCO signal to be locked;

b. filtering the mixer products to provide two substantially identical signals in quadrature-phase relation to one another;

c. dividing one of the substantially identical filtered signals by the other of the filtered signals in quadrature-phase relation to it so that the quotient signal output is not a function of the amplitude of said input signal; and d. applying this division quotient to a voltage-controlled oscillator as an error signal to control the frequency of the VCO signal to be locked.

7. A phase-lock loop comprising:

first mixer means;

second mixer means;

input means for applying an input signal to said first and said second mixer means;

voltage-controlled oscillator means applying its output signal directly to said first mixer means to be mixed with the input signal and also applying its output signal phaseshifted by 90° to said second mixer to be mixed with the input signal;

means for filtering the quadrature-related outputs from said first and second mixer means and applying as outputs two signals substantially identical except for a quadrature phase relationship; and means for taking said substantially identical outputs from said filtering means and generating a signal therefrom which is not a function of the amplitude of the input signal and applying this generated signal back to said voltage-controlled oscillator as the control signal.

* * * * *